(12) United States Patent  
Pan

(10) Patent No.: US 6,265,241 B1
(45) Date of Patent: Jul. 24, 2001

(54) METHOD OF FORMING A PHOTO DIODE ON A SEMICONDUCTOR

(75) Inventor: Jui-Hsiang Pan, Hsin-Chu (TW)

(73) Assignee: United Microelectronics Corp., Hsin-chu (TW)

( * ) Notice: Subject to any disclaimer, the term of this patent is extended or adjusted under 35 U.S.C. 154(b) by 0 days.

(21) Appl. No.: 09/422,955

(22) Filed: Oct. 22, 1999

(51) Int. Cl.[7] .................................................. H01L 21/00
(52) U.S. Cl. ............................................................. 438/57
(58) Field of Search ................................ 438/57, 73, 404, 438/405; 257/431, 443, 446

(56) References Cited

U.S. PATENT DOCUMENTS 5,585,653 * 12/1996 Nakashiba ............................ 257/232
5,600,173 * 2/1997 Suzanga ................................ 257/446

* cited by examiner

Primary Examiner—Keith Christianson
(74) Attorney, Agent, or Firm—Winston Hsu

(57) ABSTRACT

The present invention relates to a method of forming a photo diode on a semiconductor wafer. The method comprises forming a pad silicon oxide layer on the substrate and a silicon nitride layer on the pad silicon oxide layer. Then, remove portion of the silicon nitride layer over which the remaining silicon nitride layer defines a photo sensor area and at least one dummy active area on the pad silicon oxide layer. Next, each dummy active area are positioned surrounding the photo sensor area with a narrow slot in between which is not covered by the silicon nitride layer. Next, perform a thermal oxidation process over the slot to form a field oxide layer, the dummy active area is used to reduce the thickness of the field oxide layer in the slot. Then, remove the remaining silicon nitride layer by using a wet etching process. Finally, forming a P/N junction in the photo sensor area to form a photo diode, thus the leakage current of the photo diode in unlighted status can be decreased and improve the signal to noise ratio.

3 Claims, 5 Drawing Sheets

METHOD OF FORMING A PHOTO DIODE ON A SEMICONDUCTOR

BACKGROUND OF THE INVENTION

1. Field of the Invention

The present invention relates to a method of forming a photo diode on a semiconductor wafer, and more particularly, to a method of forming a photo diode with dummy active areas.

2. Description of the Prior Art

The photo diode is a bi-electrode semiconductor device comprising a photo-conductivity cell and a junction diode and is typically used in the design and layout of optical products such as cameras and scanners. When not lit, the leakage current represents the noise but when lit the leakage current represents the signal. The photo diode manages signal information utilizing the signal-to-noise ratio. By increasing the intensity of the ratio of the signal to noise, the contrast of the signal and the quality of the photo diode are improved.

Please refer to FIG. 1 and FIG. 2. FIG. 1 is a schematic diagram of the structure of the prior art photo diode 10. FIG. 2 is a schematic diagram of the processing of the field oxide 16 on the photo diode 10. The formation of the prior art photo diode 10 is performed on the substrate 10 of a semiconductor wafer. The photo diode 10 comprises a photo sensor area 12 positioned on a predetermined area of the substrate 14, and a field oxide 16 positioned on the substrate 14 surrounding the photo sensor area 12. The field oxide 16 acts as dielectric insulating material to prevent short circuiting secondary to contact between the photo sensor area and other units.

In the formation of the prior art photo diode 10, a pad oxide layer 17 and a silicon nitride layer 18 are deposited in order on the substrate 14 and are used as a mask for the local oxidation of silicon to define an active area for the photo sensor area 12.

When the semiconductor wafer undergoes thermal oxidation in a furnace, the field oxide layer 16 is generated only on the portion of substrate 14 not covered by the silicon nitride layer 18 due to the fact that moisture and oxygen do not penetrate the silicon nitride layer 18 and substrate 14 well.

However, moisture and oxygen can still reach the substrate 14 immediately surrounding the silicon nitride layer 18 by spreading horizontally to cause oxidation. This causes a bird's beak profile on the field oxide layer 16, as shown in FIG. 2 and subsequent stress between the substrate 14 and the field oxide layer 16. As the thickness of the field oxide layer 16 increases, so does the stress between the substrate 14 and the field oxide 16. This leads to increase of leakage current in the PN junction of the photo sensor area 12 and noise of the photo diode 10.

SUMMARY OF THE INVENTION

It is therefore a primary objective of the present invention to provide a method of forming a new photo diode, which reduces the leakage current of the photo diode when unlit, decreases the intensity of the noise and improves the quality of the photo diode.

In a preferred embodiment, the present invention relates to a method of forming a photo diode on a semiconductor wafer comprising:

forming a pad silicon oxide layer on the substrate and a silicon nitride layer on the pad silicon oxide layer;

removing portion of the silicon nitride layer over which the remaining silicon nitride layer defines a photo sensor area and at least one dummy active area on the pad silicon oxide layer, each dummy active area being positioned surrounding the photo sensor area with a narrow slot in between which is not covered by the silicon nitride layer;

performing a thermal oxidation process over the slot to form a field oxide layer, the dummy active area being used to reduce the thickness of the field oxide layer in the slot;

removing the remaining silicon nitride layer by using a wet etching process; and forming a P/N junction in the photo sensor area to form a photo diode.

It is an advantage of the present invention that stress between the substrate and the field oxide layer is reduced and the signal to noise ratio of the photo diode is improved.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
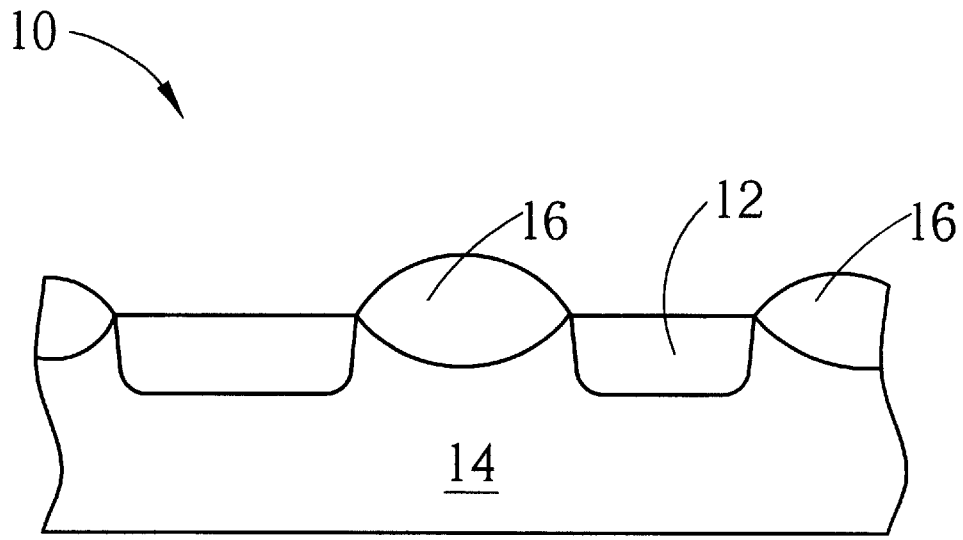
FIG. 1 is a schematic diagram of the structure of prior art photo diode 10.
Figure 2:
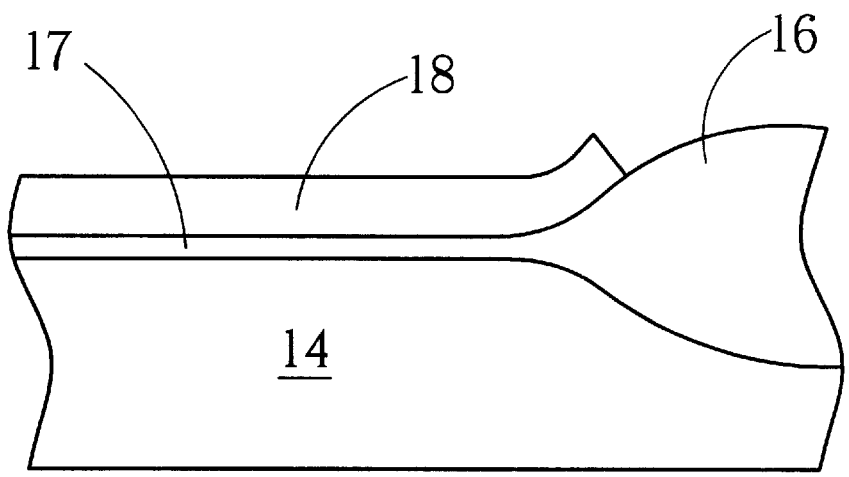
FIG. 2 is a schematic diagram of the process of the field oxide 16 on the photo diode 10.
Figure 3:
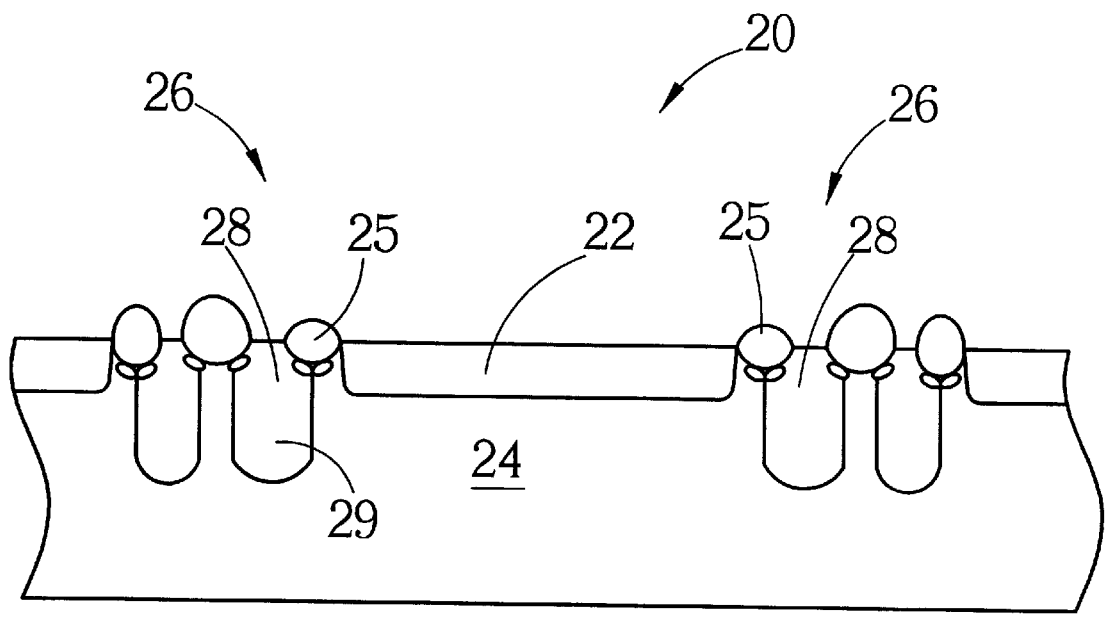
FIG. 3 is a schematic diagram of the structure of the photo diode according to the present invention.

Please refer to FIG. 3. FIG. 3 is a schematic diagram of the structure of the photo diode 20 according to the present invention. The photo diode 20 in the present invention is formed on the Si substrate 24 of a semiconductor wafer. The photo diode 20 comprises a photo sensor area 22 positioned in a predetermined region of the substrate 24, and a dielectric area 26 positioned on the substrate 24 surrounding the photo sensor area 22. The dielectric area 26 is used as dielectric insulating material to prevent short circuiting secondary to contact between the photo sensor area and other units. The dielectric area 26 comprises a field oxide layer 25 on the substrate 24 and has two dummy active areas 28 surrounding the photo sensor area 22. The dummy active areas 28 are not covered by the field oxide layer 25.

Figure 4:
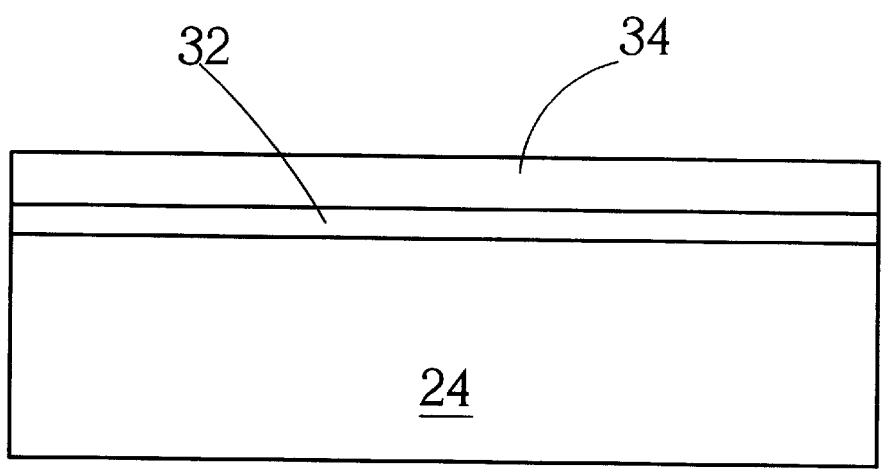
FIG. 4 to FIG. 8 are schematic diagrams of the process of the photo diode according to the present invention.
Figure 5:
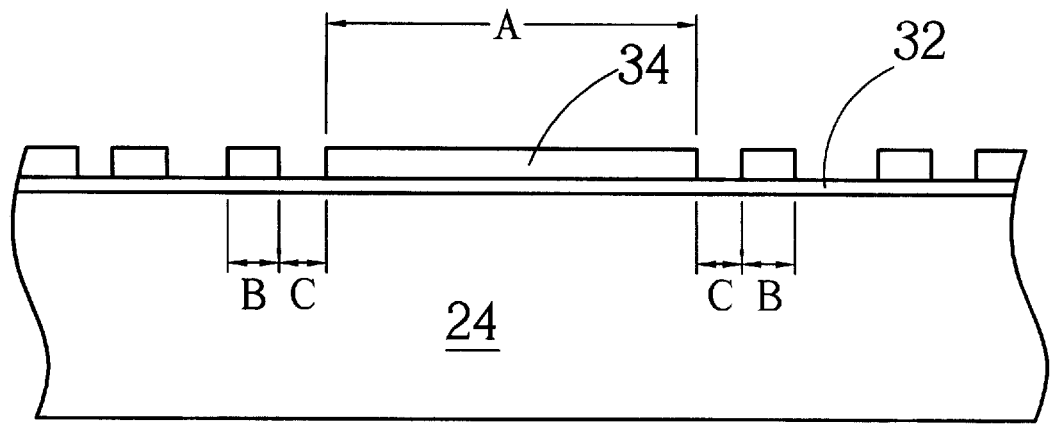

Please refer to FIG. 4 to FIG. 8. FIG. 4 to FIG. 8 are schematic diagrams of the processing of the photo diode 20 according to the present invention. The present invention process of formation of the photo diode 20 entails first forming a pad silicon oxide layer 32 on the substrate 24 of a P-type semiconductor wafer by thermal oxidation, then forming a silicon nitride layer 34 on the pad silicon oxide layer 32 by chemical vapor deposition, as shown in FIG. 4. Next, the photolithography process and etching process are performed to remove a portion of the silicon nitride layer 34 defining a photo sensor area 22 and at least one dummy active area 28 with the remaining silicon nitride layer 34. Each dummy active area 28 surrounds the photo sensor area 22 and is separated from the photo sensor area 22 with a narrow slot, as shown in FIG. 5. This slot is not covered by the silicon nitride layer 34. The region labeled as A in FIG. 5 represents the photo sensor area 22, the region labeled as B represents the dummy active region 28, and the region labeled as C represents the narrow slot.

Figure 6:
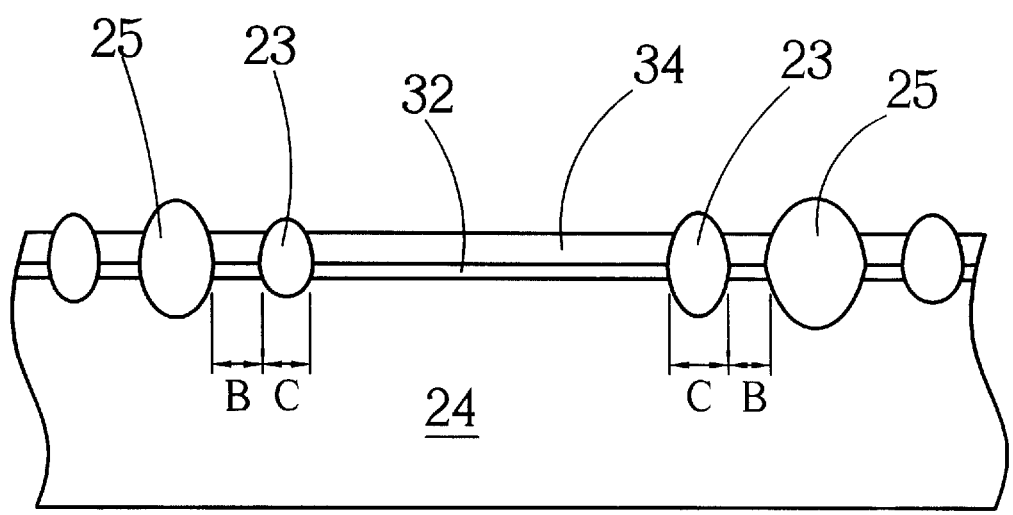

A thermal oxidation process is performed over the slot to form a field oxide layer 23, 25 as shown in FIG. 6. The thickness of the field oxide layer 23 in the narrow slot varies in relation to the distance between the dummy active area 28 and the photo sensor area 22. In the formation of the dielectric area 26, the dummy active area 28 is used to reduce the thickness of the field oxide layer 23 in the narrow slot. Thermal oxidation comprises a hot annealing process to repair damages over the surface of the semiconductor wafer occurring during the formation of the field oxide layer.

Figure 7:
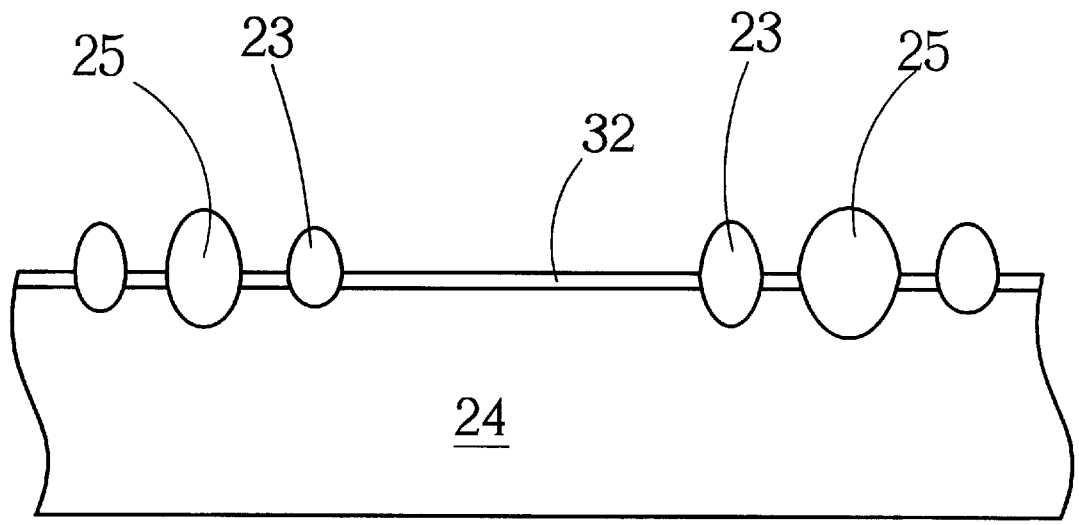
Figure 8:
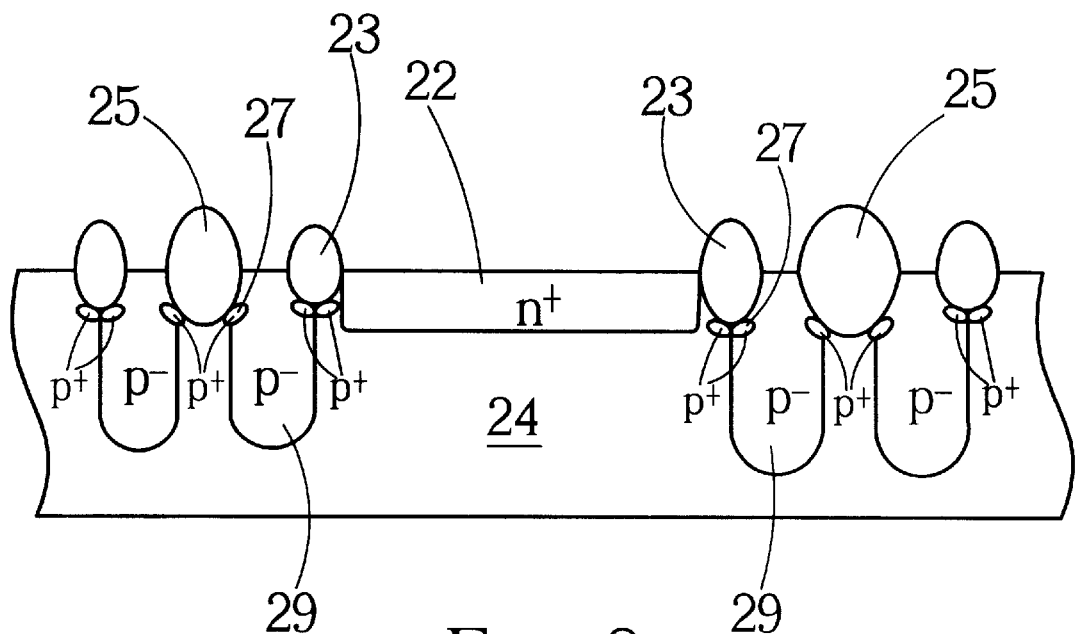

Next, a wet etching process is performed to remove the silicon nitride layer 34 from the pad silicon oxide layer 32, as shown in FIG. 7. Afterwards, ion implantation is performed to form a channel stop area 27 containing P-type dopant on two sides below the field oxide layers 23, 25 and to form an anti-punch through area 29 between two field oxide layer 23, 25, as shown in FIG. 8. The dopant in the channel stop area 27 and the anti-punch through area 29 is identical to the dopant in the substrate. Then, ion implantation is repeated to implant N-type dopant to form a P/N junction in the photo sensor area 22. Lastly, an etching process is performed to remove the pad silicon oxide layer 32. This completes formation of the photo diode 20 in the present invention.

The dielectric area 26 comprises a dummy active area 28 and the thickness of the field oxide layer 23 in the dielectric area 26 varies in relation to the distance between the dummy active area 28 and the photo sensor area 22. The width of the narrow slot between the dummy active area 28 and the photo sensor area 22 is narrow and the field oxide layer 23 in the narrow area is accordingly thinner. Therefore, the post-thermal oxidation profile of the field oxide layer 23 can be improved and the stress between the substrate 24 and the field oxide layer 23 is reduced. Further, leakage current of the P/N junction surrounding the photo sensor area 22 is reduced thus improving the signal-to-noise ratio. Also, the channel stop area 27 formed on two sides below the field oxide layer 23 insulates the electric connection of the channel below the field oxide layer 23. The anti-punch through area 29 prevents punch through of the dummy active area 28.

Figure 9:
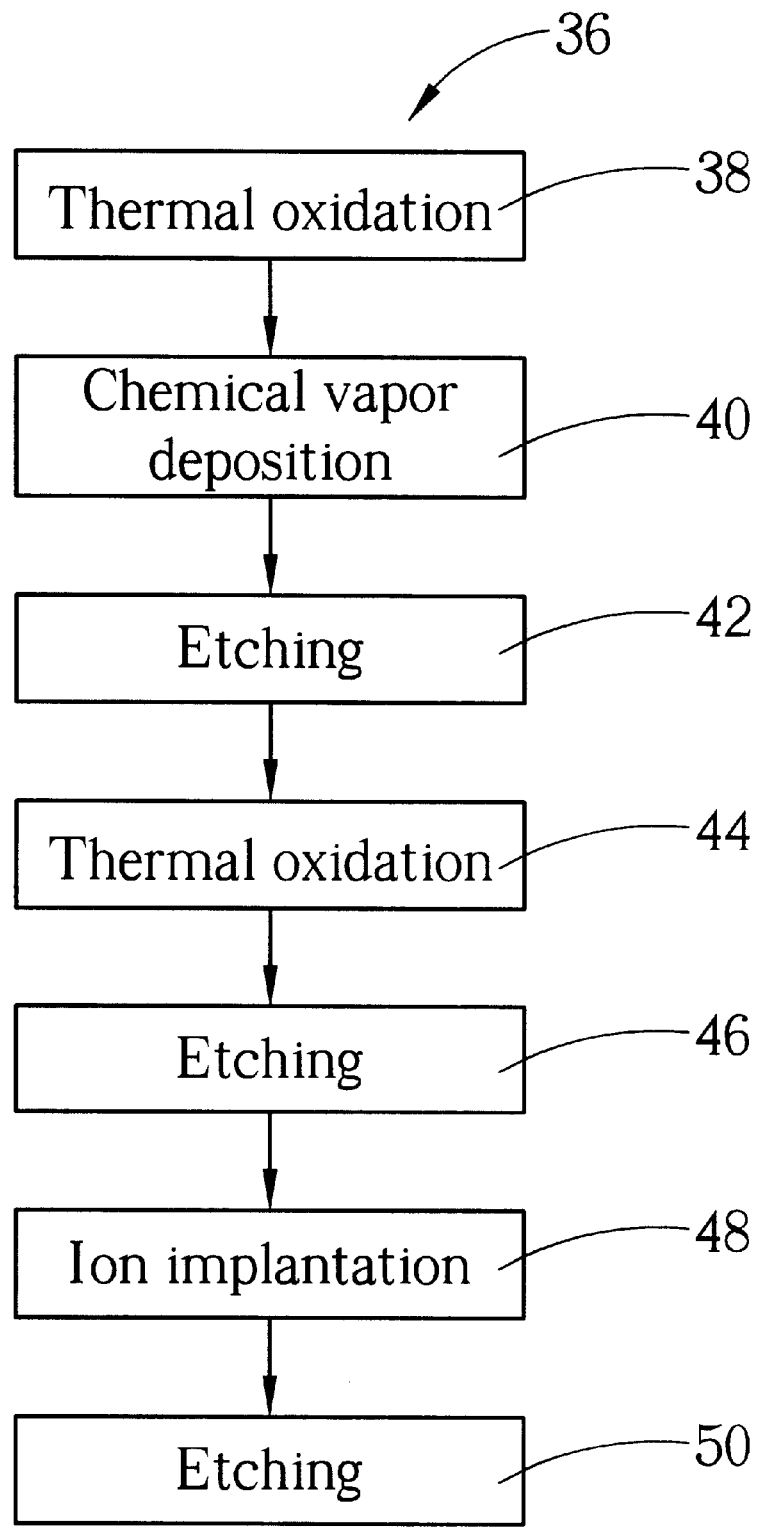
FIG. 9 is flow chart of the process of the photo diode according to the present invention.

Please refer to FIG. 9. FIG. 9 is a flow chart of the photo diode processing according to the present invention. The method of photo diode 20 in the present invention comprises the following steps:

Step 38: performing a thermal oxidation process to form a pad silicon oxide layer 32.

Step 40 performing a chemical vapor deposition to form a silicon nitride layer 34.

Step 42: performing an etching process on the silicon nitride layer 32 to form a photo sensor area 22 and least one dummy active area 28 on the pad silicon oxide layer 32.

Step 44: performing a thermal oxidation process to form field oxide layer 23,25 on the area not covered by the silicon nitride layer 34.

Step 46: performing a wet etching process to remove the silicon nitride layer 34.

Step 48: performing an ion implantation process to form a P-type anti-punch through area 29 and a channel stop area 27, and form a P/N junction in the photo sensor area 24.

Step 50: performing an etching process to remove the pad silicon oxide layer 32 to complete the processing of the photo diode 20.

In contrast to the prior art photo diode 10, the dielectric area 26 of the photo diode 20 in the present invention comprises a dummy active area 28. The distance between the dummy active area 28 and the photo sensor area 22 is controlled to limit the thickness of the field oxide layer 23 surrounding the photo sensor area 22 resulting in a reduction in the thickness of the field oxide layer 23. In the present invention, stress between the field oxide layer 23 and the substrate 24 is reduced as well as leakage current of the photo diode 20 when unlit. This leads to an improved signal-to-noise ratio and overall quality of the photo diode 20.

Those skilled in the art will readily observe that numerous modifications and alteration of the device may be made while retaining the teachings of the invention. Accordingly, the above disclosure should be construed as limited only by the metes and bounds of the appended claims.

What is claimed is:

1. A method of forming a photo diode on a semiconductor wafer comprising:

forming a pad silicon oxide layer on the substrate and a silicon nitride layer on the pad silicon oxide layer;

removing portion of the silicon nitride layer over which the remaining silicon nitride layer defines a photo sensor area and at least one dummy active area on the pad silicon oxide layer, each dummy active area being positioned surrounding the photo sensor area with a narrow slot in between which is not covered by the silicon nitride layer;

performing a thermal oxidation process over the slot to form a field oxide layer, the dummy active area being used to reduce the thickness of the field oxide layer in the slot;

removing the remaining silicon nitride layer by using a wet etching process; and forming a P/N junction in the photo sensor area to form a photo diode.

2. The method o-f claim 1 wherein the thermal oxidation process comprises a hot annealing process to repair damages over the surface of the semiconductor wafer which are created when forming the field oxide layer.

3. The method of claim 1 wherein the thickness of the field oxide layer in the slot varies in relation to the distance between the dummy active area and the photo sensor area.

* * * * *